United States Patent
Draaijer

[19]

[11] Patent Number: 6,051,967
[45] Date of Patent: Apr. 18, 2000

[54] ELECTRIC FIELD MEASUREMENT SYSTEM

[75] Inventor: Maurice H. J. Draaijer, Eindhoven, Netherlands

[73] Assignee: U.S. Philips Corporation, New York, N.Y.

[21] Appl. No.: 08/836,909

[22] PCT Filed: Sep. 8, 1995

[86] PCT No.: PCT/IB95/00744

§ 371 Date: Apr. 30, 1997

§ 102(e) Date: Apr. 30, 1997

[87] PCT Pub. No.: WO97/09627

PCT Pub. Date: Mar. 13, 1997

[51] Int. Cl.[7] .................................................. G01R 27/26
[52] U.S. Cl. ............................................. 324/72; 324/452
[58] Field of Search ............................... 324/72, 72.5, 96, 324/452, 457; 136/261.1; 257/290

[56] References Cited

U.S. PATENT DOCUMENTS

| | | | |
|---|---|---|---|
| 3,772,592 | 11/1973 | Rhodes | 324/72 |
| 3,828,256 | 8/1974 | Liu | 324/72 |
| 3,873,919 | 3/1975 | Vosteen | 324/72 |
| 3,916,305 | 10/1975 | Few, Jr. | 324/72 |
| 3,919,636 | 11/1975 | Few | 324/72 |
| 4,328,461 | 5/1982 | Butters | 324/72 |
| 4,976,860 | 12/1990 | Holloman | 136/246 |
| 5,164,662 | 11/1992 | Emery | 324/96 |
| 5,210,467 | 5/1993 | Ito et al. | 250/227.11 |
| 5,575,860 | 11/1996 | Cherney | 136/245 |

FOREIGN PATENT DOCUMENTS 4428336  12/1994  Germany .

OTHER PUBLICATIONS

Electronis One–Seven: Hayden see pp. 2–203–90–91, Dec. 1967.

*Primary Examiner*—Maura Regan
*Attorney, Agent, or Firm*—Robert J. Kraus

[57] ABSTRACT

An electric field measurement system for precisely measuring low frequency electric fields includes a capacitive antenna having two parallel conductive plates (11, 12). The potential between the plates is a measure of the electric field present. A high impedance element (13) supplies the potential between the plates to an electro-optical converter (14) which converts the potential into an optical signal. The optical signal is coupled into an optical fiber (20) which transports the optical system to an optical-electrical converter (30), where the optical signal is converted into an electric signal, which is measured by a measurement device (31), e.g. a spectrum analyzer. The use of an optical fiber avoids disturbances of the field to be measured. The dimensions of the plates of the capacitive antenna, preferably, are only a few centimeters, thereby minimizing the influence of the antenna on the field to be measured. The high impedance element provides accurate measurement of weak, low frequency electric fields (e.g. of only a few Hz).

15 Claims, 3 Drawing Sheets

ELECTRIC FIELD MEASUREMENT SYSTEM

BACKGROUND OF THE INVENTION

The present invention relates to a measurement system for measuring a low frequency electric field, the system comprising a capacitive antenna and a measurement device coupled thereto, the capacitive antenna comprising two parallel conductive plates, whereby an electric potential between the plates is a measure of the electric field.

Such a measurement system can, for example, be used for measuring unwanted low frequency electric fields generated by electronic devices. Sources of such unwanted low frequency electric fields are for example AC power-supplies fed from the AC supply, which generate unwanted fields at a frequency of 50/60 Hz and their harmonics, deflection coils in screens of television sets, which generate unwanted fields at a frequency of 15 kHz and its harmonics, and switch mode power supplies generating unwanted fields in the frequency band from 20 kHz to 200 kHz. Such unwanted fields can interfere with low frequency radio fields. Furthermore low frequency fields could be dangerous to people. Therefore, EMC-regulations are in force formulating requirements regarding the fields which electronic equipment is allowed to generate. Nowadays the awareness of the possible danger caused by such unwanted fields is growing. Therefore EMC-regulations are tending to become more severe. In order to check if electronic equipment fulfills such severe EMC-demands, measuring systems are needed which measure the fields very accurately. Furthermore the measurements carried out need to be reproducible.

In a known measurement system according to the preamble, which is used to measure low frequency electric fields generated by television sets, the capacitive antenna consists of a first plate having a length and width of some tens of centimeters and a smaller second plate parallel to the first plate. The antenna is connected to the measuring apparatus by a coaxial cable. One of the plates of the antenna is connected to the outer conductor of a coaxial cable, while the other plate is connected to the inner conductor thereof. This means that the electric potential between the plates is measured over the impedance of the coaxial cable, which impedance usually has a rather low value. Since the impedance caused by the capacitance between the two plates is much larger than the impedance of the cable, the signal measured over the impedance of the cable is only a small part of the potential present between the plates. Because of the noise also present over this impedance, it is impossible to accurately measure weak low frequency electric fields with this measurement system. Furthermore the use of an electrically conducting cable between the antenna and the measuring device introduces disturbances in the electric field to be measured. Since these disturbances are highly dependent on the exact position of the electrically conducting cable, this also considerably leads to a poor reproducibility of the measurements done with this system. Finally, the large first plate of the antenna also influences the electric field to be measured.

SUMMARY OF THE INVENTION

It is an object of the invention to provide a measurement system for measuring low frequency electric fields, which is able to accurately measure weak low frequency electric fields with a good reproducibility.

Thereto a measurement system according to the invention is characterized in that the plates of the capacitive antenna have small dimensions and the capacitive antenna further comprises a high impedance element arranged between the plates. An electrical-optical converter converts the electric potential into an optical signal and the measurement system also comprises an optical fiber for transporting the optical signal to the measurement device. And optical-electrical converter converts the optical signal into an electric signal to be measured by the measurement device. Due to the small dimensions of the plates, only a few centimeters, their influence on the electric field to be measured is small. The capacitance present between the two planes has a low value. This means that the impedance caused by the capacitance at low frequencies has a high value. However, by coupling the plates to the measurement device over a high impedance element, preferably having an impedance being at least of the same order of magnitude as the impedance of the capacitance between the antenna plates at the lowest frequency at which the electric field is to be measured, weak fields can be measured accurately. By using an optical fibre to transmit the signal to be measured to the measuring device instead of an ordinary electrically conductive cable, the disturbances in the electric field to be measured, that would otherwise be caused by such an electrically conductive cable, are avoided.

A further embodiment of the measurement system according to the invention is characterized in that the capacitive antenna comprises a space for placing a battery for feeding the electrical-optical converter with supply power. In this way it is avoided that the electric/optical converter is fed by the use of an electric current being transported to the antenna by an electrically conductive cable. Such an electrically conductive cable, as already said, would cause disturbances in the electric field to be measured.

A further embodiment of the measurement system according to the invention is characterized in that it comprises a further optical fibre for transporting optical energy to the capacitive antenna and in that the capacitive antenna comprises an optical-electrical converter for converting the optical energy into electrical energy for feeding the electrical-optical converter with supply power. By transporting energy for feeding the electrical/optical converter using an optical fibre, there are little or no disturbances in the electric field to be measured. Furthermore, in this way a very constant DC-supply level can be obtained. Batteries have the problem that the generated supply voltage decreases due to aging. Feeding the electrical-optical converter with a very stable DC-supply, favors the accuracy of the conversion carried out by this converter.

A further embodiment of the measurement system according to the invention is characterized in that the high impedance element is an operational amplifier arranged in a buffer configuration. An amplifier arranged in this way has a very high input impedance.

BRIEF DESCRIPTION OF THE DRAWINGS

The present invention will become more clear in conjunction with the accompanying figures, in which.

Throughout the drawings, similar reference signs denote similar parts.

DESCRIPTION OF THE PREFERRED EMBODIMENTS

Figure 1:
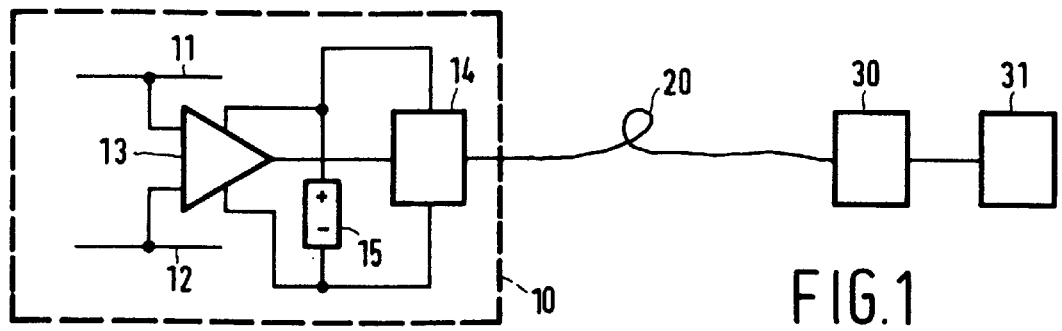
FIG. 1 shows a block diagram of the measurement system according to the invention in which the capacitive antenna comprises a battery feed.

FIG. 1 shows a block diagram of the measurement system according to the invention. This measurement system comprises a capacitive antenna 10 for measuring a low frequency electric field. The antenna comprises two parallel conductive plates 11,12, an amplifier with a high input impedance 13, an electrical optical converter 14 and a battery feed 15. The antenna is connected to an optical fibre 20, which is connected to an optical-electrical converter 30. The optical-electrical converter is connected to a measurement device 31 of a well known type, for example a spectrum analyzer.

The potential between the plates 11 and 12 is a measure of the electric field. This potential is provided to the amplifier 13. This amplifier 13 has a very high input impedance. This input impedance should preferably be at least of the same order of magnitude as the impedance caused by the capacitance between the plates 11 and 12 at the lowest frequency to be measured. In this way the potential between those plates is not or hardly influenced by the amplifier 13. From the amplifier 13, the signal to be measured is provided to the electrical-optical converter 14, which converts this electrical signal into an optical signal. This optical signal is then transmitted via the optical fibre 20 to the optical-electrical converter 30, which converts the optical signal into an electrical signal again, which is measured by the measurement device 31. The battery 15 supplies the amplifier 13 and the electrical-optical converter 14 with supply power.

Figure 2:
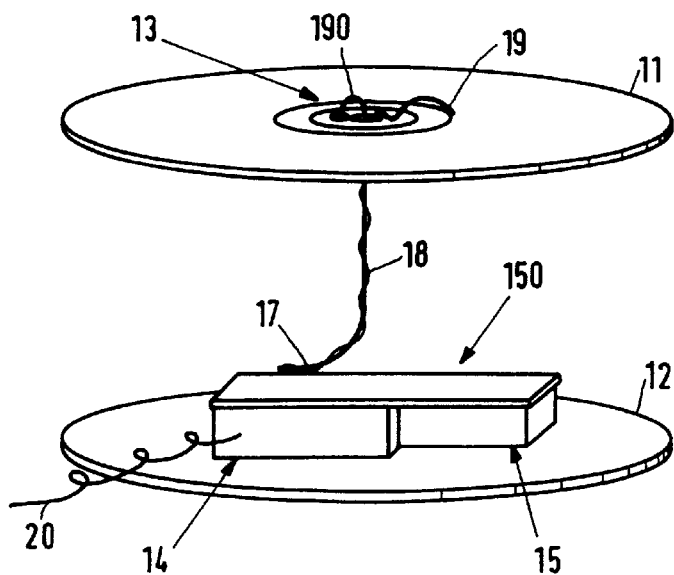
FIG. 2 is a realistic drawing of the capacitive antenna used in this measurement system.

FIG. 2 is a realistic drawing of the capacitive antenna used in this measurement system. The plates 11 and 12 are round. In order to keep their influence on the field to be measured small, they should have small dimensions. Applicant has obtained good results with plates having a radius of 44 mm, but other dimensions are also possible. Round plates have the property that they do not comprise edges, where a concentration of charge could take place. Such a concentration of charge could influence the measurement. However, it is not necessary to use round plates, since square plates also give sufficient results. The amplifier 13 finds itself on the outside of plate 11. It consists of components soldered on a part of plate 11, which is electrically isolated from the rest of this plate. The battery feed 15 and the electrical-optical converter 14 find themselves on the inside of plate 12. They are arranged together in a housing 150. A semirigid cable 17 is arranged between the amplifier 13 on one side and the electrical-optical converter 14 and the battery 15 on the other side. The semirigid cable 17 consists of an inner conductor and an outer conductor. The outer conductor is arranged for transmitting positive supply power from the battery 15, as well as the low frequency electric potential of plate 12 to the amplifier 13. The outer and the inner conductor together serve as signal conductors between the amplifier 13 and the electrical-optical converter 14. The potential of the plate 11 is provided to the amplifier by a thin wire 19. Another thin wire 190 is a connection between components of the amplifier. A further thin wire 18 is arranged between the negative pole of the battery and the amplifier. Applicant has obtained good results with a distance of 73 mm between the plates. The capacitance between the plates is about 4 pF, when they have a radius of 44 mm and the distance between them is 73 mm. However, the exact distance and radius is not critical for the performance of the antenna.

Figure 3A:
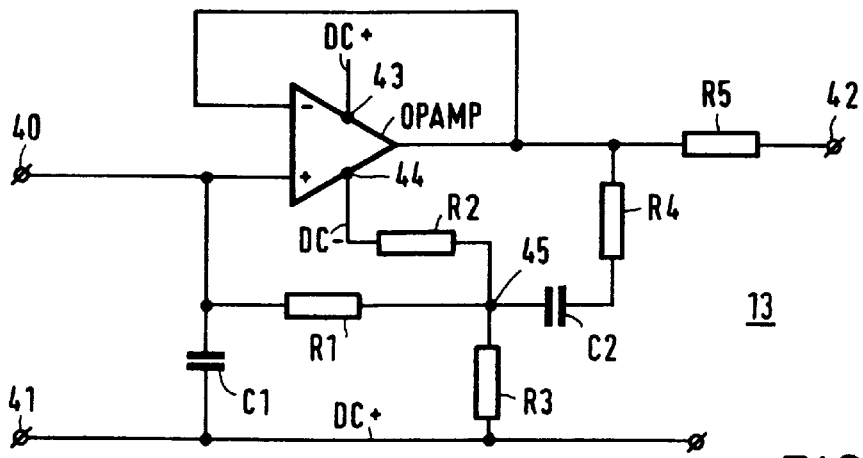
FIG. 3a is a detailed representation of the amplifier arranged in the capacitive antenna.

FIG. 3a shows the amplifier 13 in detail. The amplifier 13 comprises a first input terminal 40 connected to plate 11 and a second input terminal 41 connected to plate 12. On this second input terminal also the positive supply power DC+, coming from the battery is present. The first input terminal is connected to the positive input terminal of an operational amplifier OPAMP. The negative input terminal and the output terminal of the operational amplifier are connected. The operational amplifier has a positive supply input 43 and a negative supply input 44 for feeding the operational amplifier with supply power DC+,DC−. Between the two input terminals 40,41 a first capacitor C1 is arranged. The first input terminal 40 is connected to a first resistor R1. The first resistor R1 is further connected to a second resistor R2, a third resistor R3 and a second capacitor C2 at a common node 45. The second resistor R2 is further connected to the negative supply input 44 of the operational amplifier OPAMP. The third resistor R3 is further connected to the second input terminal 41. The second capacitor C2 is further connected to a fourth resistor R4, which is connected to the output terminal of the operational amplifier OPAMP. The output terminal is connected via a fifth resistor R5 to an output terminal 42 of the amplifier.

The amplifier functions as follows: Due to the connection between the output terminal and the negative input terminal of the operational amplifier, a very high input impedance is obtained. The first, second and third resistor R1,R2,R3 are for adjusting the input terminals of the operational amplifier to half the supply voltage, so as to have the maximum voltage swing available. R2 and R3 therefore have the same value. The resistors R1,R2,R3 all have values in the order of Mohms. The fourth resistor R4 and the second capacitor C2 are for feeding back a small part of the output voltage to the common node of resistors R1,R2 and R3. In this way it is avoided that current from the negative input terminal of the operational amplifier flows through the resistors R1,R2,R3, which would decrease the input impedance of the amplifier 13. The condensator C1 serves as a capacitive divider together with the capacitance between the antenna plates. The fifth resistor R5 increases the output of the operational amplifier. The amplifier 13 is a sort of an impedance transformer buffer between the plates and the electrical-optical converter having a very high input impedance and a signal amplification of approximately 1.

Figure 3B:
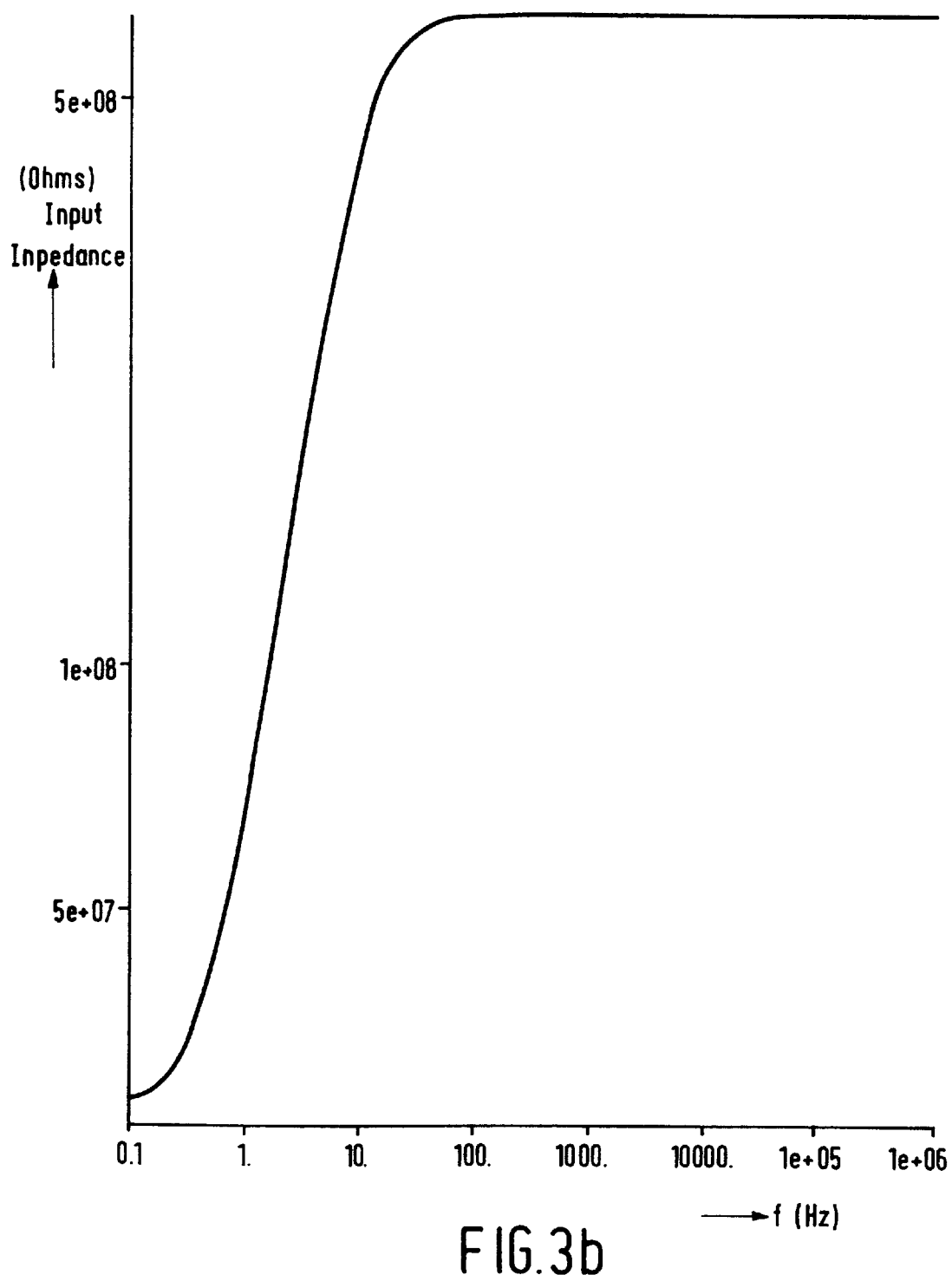
FIG. 3b is a diagram of the calculated input impedance of the amplifier as a function of frequency.

FIG. 3b shows the calculated input impedance of the amplifier 13 as a function of frequency. It can be seen that for frequencies higher than a few tenths of Hz the input impedance has a value of more than 500 Mohms. The equivalent impedance of the capacitor between antenna plates (4 pF) at 50 Hz is about 750 Mohms, which is in the same order of magnitude.

Figure 4:
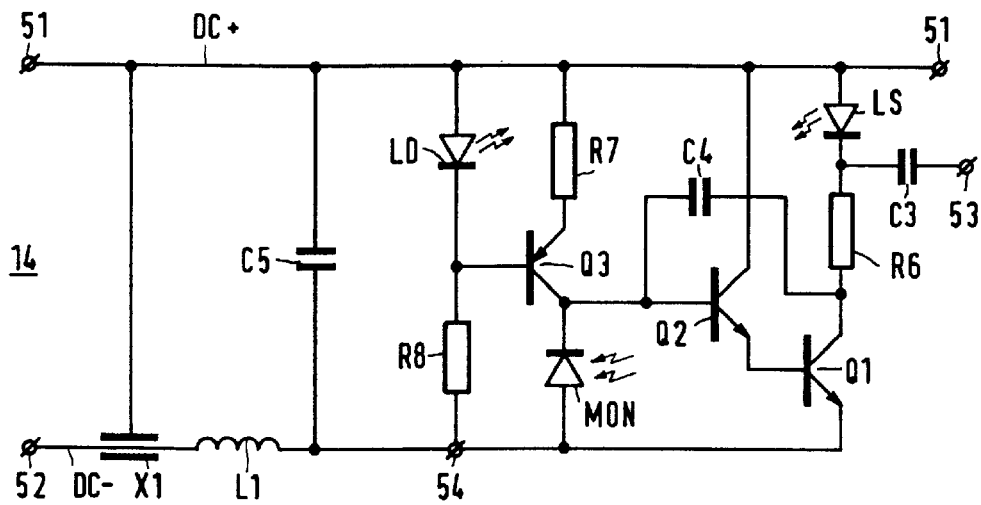
FIG. 4 is a detailed representation of the electrical-optical converter arranged in the capacitive antenna.

The electrical-optical converter 14 is shown in detail in FIG. 4. The electrical-optical converter comprises supply terminals 51,52 for feeding the converter with supply power coming from the battery 15. Supply terminal 51 is connected to the input terminal 41 of the amplifier 13. The electrical-optical converter further has an input terminal 53 connected to the output terminal 42 of the amplifier 13. It further comprises a laser LS arranged between the terminals 51 and 53. The laser is connected in series with a sixth resistor R6 and a first transistor Q1, which is of the npn-type. Between the input terminal 53 and the laser LS a third capacitor C3 is arranged. The transistor Q1 is connected to a second transistor Q2, also of the npn-type, in a Darlington-configuration. The emitter of transistor Q2 is connected to the base of transistor Q1 and the collector is connected to terminal 51. Between the base of transistor Q2 and the collector of transistor Q1 a fourth condensator C4 is provided. The base of transistor Q2 is connected to the collector of a third transistor Q3, which is of the pnp-type. The collector of transistor Q3 is further connected to a monitor MON, e.g. a photodiode, which monitors the quantity of light generated by the laser LS. The emitter of transistor Q3 is connected to terminal 51 via a seventh resistor R7. The base of transistor Q3 is connected to an eighth resistor R8, which is connected to the monitor MON and the first transistor Q1 via a common node 54, and to a light emitting diode LD, which is in turn connected to terminal 51. Parallel to resistor R8 and the light emitting diode LD, a fifth condensator C5 is provided. In series with the capacitor C5, a coil L1 is connected. Between the two supply points 51,52 and the coil as arranged a feed through capacitor X1 through the housing 150 of the battery and the laser.

The electrical-optical converter functions as follows: The electrical signal present between points 51 and 53 is provided to laser LS. The laser LS modulates this electrical signal on an optical wave with a wavelength of about 1310 nm, which is coupled to the optical fiber 20. The transistors Q1 and Q2 have as their purpose to keep the supply current of the laser at a constant value. Resistor R6 is for protecting the laser against an excessively large current, which might occur should the transistors Q1 and Q2 short circuit. Condensator C3 is for blocking DC-currents, coming from amplifier 13.

When the supply voltage generated by the battery decreases, for example due to aging, also the current through laser LS and therefore the quantity of light generated by the laser LS will decrease. The current through the monitor MON then also decreases, this leading to an increase of the voltage on the base of transistor Q2, which leads to an increase of the current through the laser LS. In this way the supply current flowing through the laser LS is kept constant. Capacitor C4 functions as a sort of a delay element, making sure that low frequency variations of the light caused by modulation of the light wave by the electric signal between terminals 51 and 53 do not have any influence on the control of the supply current through the laser. Light emitting diode LD, resistors R7 and R8 and transistor Q3 together form a constant current source. Capacitor C5, coil L1 and feed through capacitor X1 are for filtering peaks on the supply voltage, which otherwise would cause disturbances in the supply current of the laser.

The laser LS and the monitor MON are arranged within one housing. The type number of the component, comprising the laser and the monitor, is CQF-57 of Philips Opto-electronic Centre (POC).

The light emitting diode LD assures that temperature variations hardly influence the current supplied by the constant current source, consisting of R7, R8, Q3 and LD. This is due to the fact that the light emitting diode LD is a p-n junction in parallel with the p-n junction of transistor Q3. Instead of the light emitting diode LD any other component can be used, which together with transistor Q3 and resistors R7 and R8 forms a constant current source. The light generated by this light emitting diode is not used within the electrical-optical converter.

Figure 5:
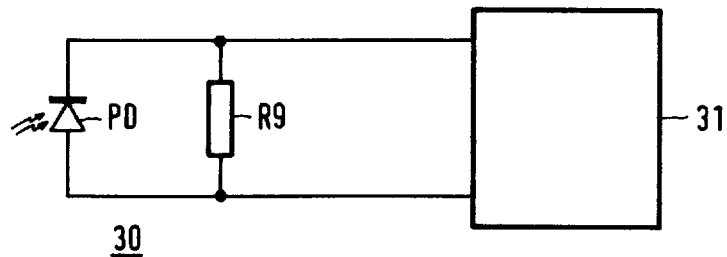
FIG. 5 is a detailed representation of the optical-electrical converter arranged in the measurement system.

FIG. 5 shows optical-electrical converter together with the measurement device. The optical-electrical converter 30 consists of a photodiode PD, for example a photodiode of the type CPF23/D76 of the Philips Opto-electronic Centre (POC), with a resistor R9 parallel thereto. The photodiode is not fed with supply voltage. The optical-electrical converter is connected to the measurement device 31. This measurement device can be of any known type, for example a spectrum analyzer.

Resistor R10 dissipates the DC-current which is generated by the photodiode. It has such a value that it keeps the DC-voltage across the photodiode below 1,3 V. In this way the photodiode is kept nonconductive. This makes it possible that the photodiode demodulates the incoming optical wave, which comes out of the optical fiber 20, thereby obtaining an electrical signal, which is to be measured by the measurement device.

With the measurement system as described in FIG. 1–5 it is possible to measure electric fields in the frequency band from about 40 Hz to 10 MHz. The amplifier 13 operates from DC to 10 MHz, but its high frequency −3 dB-point is about 2 MHz. The electrical-optical converter operates up to 2 GHz, but its low frequency −3 dB-point is about 2 kHz. Therefore it is necessary to use a frequency dependent calibration factor.

Figure 6:
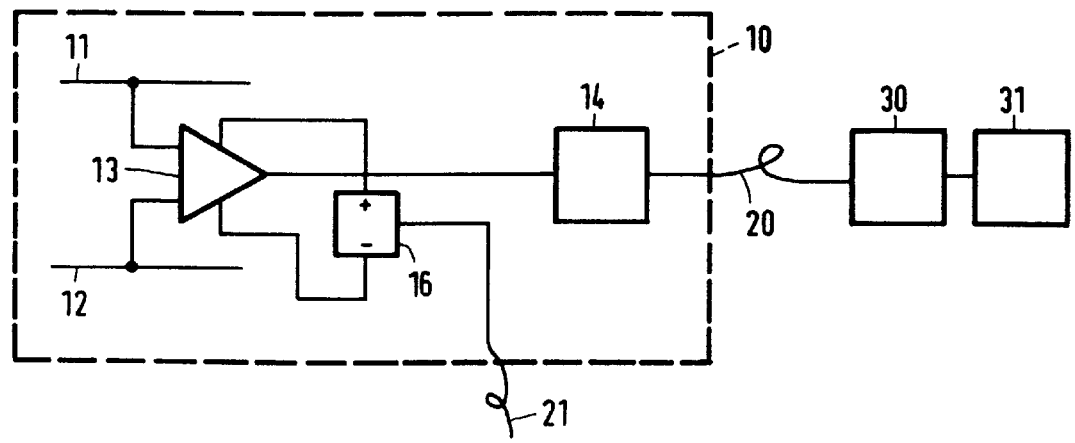
FIG. 6 shows a block diagram of the measurement system according to the invention in which the capacitive antenna is fed with optical energy via an optical fibre.

FIG. 6 shows a block diagram of the measurement system according to the invention in which the capacitive antenna is fed with optical energy via an optical fiber. In the optical fiber 21 a non-modulated light wave is coupled. This light wave falls on an optical-electrical converter, for example a photodiode, within the capacitive antenna, which converts this light wave into a DC-electric current which can be used as the supply current for the amplifier 13 and the electrical-optical converter 14. In this measurement system the disadvantages of a battery feed, decreasing supply voltage due to aging and having to change the battery when it is empty, are avoided.

The embodiments of the present invention described herein are intended to be taken in an illustrative and not a limiting sense. Various modifications may be made to these embodiments by persons skilled in the art without departing from the scope of the present invention as defined in the appended claims. For example instead of using an operational amplifier also an amplifier with a high input impedance can be obtained, using seperate FETs.

I claim:

1. A measurement system for measuring a low frequency electric field, comprising:

a capacitive antenna which includes first and second parallel, spaced-apart conductive plates, whereby an electric potential is produced across the first and second conductive plates in response to a received electric field to be measured;

a high input impedance operational amplifier having a first input coupled to the first conductive plate, a second input coupled to the second conductive plate, and an output, wherein the input impedance of the operational amplifier is at least of the same order of magnitude as an impedance caused by a capacitance between the first and second conductive plates of the capacitive antenna at the lowest frequency to be measured;

an electro-optical converter having an input coupled to the output of the high input impedance operational amplifier in order to convert the output of the operational amplifier into an optical signal;

a first optical fiber for transporting the optical signal;

a first opto-electrical converter coupled to the first optical fiber for converting the optical signal into an output electrical signal which is indicative of the electric potential; and, a measurement device coupled to the output electrical signal for measuring the electric potential.

2. The measurement system as set forth in claim 1, further comprising a battery located in the space between said first and second conductive plates and which supplies power to both the operational amplifier and the electro-optical converter.

3. The measurement system as set forth in claim 1, wherein the measurement device includes the first opto-electrical converter.

4. The measurement system as set forth in claim 1, wherein the operational amplifier is configured as an impedance transform buffer electrically coupled between the first and second plates of the capacitive antenna and the electro-optical converter.

5. The measurement system as set forth in claim 1, further comprising a power supply for feeding power to the electro-optical converter which includes:

a second optical fiber for transporting optical energy; and, a second opto-electrical converter coupled to the second optical fiber for converting the optical energy into electrical energy for feeding the electro-optical converter with supply power.

6. The measurement system as set forth in claim 1, wherein the first opto-electrical converter is configured to operate without a supply voltage.

7. A capacitive antenna for use in a measurement system for measuring a low frequency electric field, the capacitive antenna comprising:

first and second parallel, spaced-apart conductive plates, whereby an electric potential is produced across the first and second conductive plates in response to a received electric field to be measured;

a high input impedance operational amplifier having a first input coupled to the first conductive plate, a second input coupled to the second conductive plate, and an output, wherein the input impedance of the operational amplifier is at least of the same order of magnitude as an impedance caused by a capacitance between the first and second conductive plates of the capacitive antenna at the lowest frequency to be measured; and, an electro-optical converter having an input coupled to the output of the high input impedance operational amplifier in order to convert the output of the operational amplifier into an optical signal.

8. The capacitive antenna as set forth in claim 7, wherein the operational amplifier is configured as an impedance transform buffer between the first and second plates of the capacitive antenna and the electro-optical converter.

9. The capacitive antenna as set forth in claim 7, further comprising a power supply for feeding power to the electro-optical converter which includes:

a second optical fiber for transporting optical energy; and, a second opto-electrical converter coupled to the second optical fiber for converting the optical energy into electrical energy for feeding the electro-optical converter with supply power.

10. The capacitive antenna as set forth in claim 1, further comprising a battery which supplies power to both the operational amplifier and the electro-optical converter.

11. The measurement system as claimed in claim 1 which further comprises a second optical fiber for transporting optical energy, wherein the capacitive antenna comprises an opto-electrical converter for converting the optical energy in the second optical fiber into electrical energy for feeding the electro-optical converter and the operational amplifier with supply power.

12. The measurement system as claimed in claim 1 wherein the first and second inputs of the operational amplifier are directly connected to the first and second conductive plates, respectively.

13. The measurement system as claimed in claim 1 wherein the first and second conductive plates are circular and have small dimensions in the order of a few centimeters.

14. The measurement system as claimed in claim 1 wherein the first input is directly coupled to the first conductive plate and to a non-inverting input of the operational amplifier, and the inverting input of the operational amplifier is directly coupled to the output of the operational amplifier.

15. The measurement system as claimed in claim 14 further comprising a capacitor coupled between the first and second inputs of the operational amplifier.

* * * * *